United States Patent [19]
Curlee et al.

[11] Patent Number: 5,347,430
[45] Date of Patent: Sep. 13, 1994

[54] COMPUTER CHASSIS CONSTRUCTION

[75] Inventors: James D. Curlee; Jerry D. Gandre, both of Austin, Tex.

[73] Assignee: Dell USA, L.P., Austin, Tex.

[21] Appl. No.: 43,312

[22] Filed: Apr. 6, 1993

[51] Int. Cl.$^5$ .............................................. H05K 9/00
[52] U.S. Cl. .................................. 361/816; 361/818; 361/752; 361/796; 174/35 R
[58] Field of Search ............... 361/736, 752, 816, 817, 361/818, 825, 800, 796, 797, 798, 799, 730; 174/35 R, 35 MS, 35 GC, 51

[56] References Cited
U.S. PATENT DOCUMENTS 4,916,578  4/1990  Mast ..................................... 361/818
5,047,898  9/1991  Cooke et al. ......................... 361/818
5,162,980 11/1992  Morgan et al. ..................... 174/35 R

*Primary Examiner*—Leo P. Picard
*Assistant Examiner*—Bot Ledynh
*Attorney, Agent, or Firm*—James Huffman; Jeff Hood; Rick Konneker

[57] ABSTRACT

Using specially designed molded plastic I/O output brackets having differently arranged connection opening series formed therein, a variety of differently configured computers may be manufactured using identical sheet metal chassis. Each bracket has an identical peripheral configuration, is complementarily receivable in an end wall cutout area of any of the chassis, and has a series of I/O connections formed therein which are arranged to complementarily receive the I/O connector devices mounted on the system planar board selected for incorporation within the particular chassis. When the bracket is operatively installed in the cutout area of the chassis wall a peripheral groove formed in the bracket receives an edge portion of the chassis wall and forms therewith an EMI seal having a labyrinth configuration.

12 Claims, 8 Drawing Sheets

COMPUTER CHASSIS CONSTRUCTION

BACKGROUND OF THE INVENTION

The present invention generally relates to computer apparatus, and more particularly relates to the construction of the chassis portion of a computer and the provision in the chassis of the required input/output connection openings (also referred to herein as "I/O" openings) through which external devices, such as monitors, keyboards and printers may be operatively connected to the internal operating components of the computer.

A personal computer typically includes a rectangular sheet metal chassis structure within which the internal operating components of the computer, such as the system planar board and other printed circuit boards, hard drives and floppy drives, are housed. The I/O connector portions of the computer (to which peripheral devices such as monitors, printers, keyboards and mice may be externally connected) are typically mounted on the system planar board and have connection socket portions complementarily received in openings formed in a sheet metal end wall of the computer chassis and exposed at the back side of the finished computer.

Heretofore, changes in the overall numbers, sizes and/or relative arrangements of these planar board-mounted I/O connector portions to provide a desirable variety of as-manufactured computer operating configurations have necessitated modifications in the sheet metal chassis structures from computer to computer to accommodate these configurational variations. Typically, this has entailed the use of multiple, differently configured metal parts at the I/O connector/chassis junctures. In turn, this has undesirably required that the computer manufacturer fabricate and inventory a relatively large number of differently shaped sheet metal chassis parts to provide the wide variety in computer configurations that consumers have now come to expect. Moreover, this use of separate metal parts at the connector/chassis interface tends to render the provision of a tight EMI seal in such location somewhat difficult.

In view of the foregoing it can be seen that it would be desirable to provide improved apparatus and methods for constructing a computer chassis which eliminate or at least substantially minimize the above-mentioned problems, limitations and disadvantages associated with computer chassis of conventional construction. It is accordingly an object of the present invention to provide such improved apparatus and methods.

SUMMARY OF THE INVENTION

In carrying out principles of the present invention, in accordance with a preferred embodiment thereof, using simple inexpensive unitary I/O bracket members identical chassis may be used to construct computers having, on their internal system planar boards, a variety of I/O connector device configurations and arrangements.

Each of the identical chassis are formed from sheet metal and have contiguous, perpendicular first and second walls having inner sides. The second chassis walls have identical cutout areas formed therein, and the I/O brackets have identical peripheral configurations sized to be complementarily received in and cover any of the chassis wall cutout areas.

The unitary I/O bracket members are preferably formed as plastic injection moldings and are externally coated with an electrically conductive material. According to an aspect of the present invention a substantial peripheral portion of each bracket has a groove formed therein which receives a peripheral wall edge portion of the cutout area in which the bracket is disposed. The receipt of this wall edge portion in the bracket groove creates an efficient labyrinth EMI seal at the juncture between the bracket and its associated second chassis wall.

Each I/O bracket member has formed therein I/O connection opening means configured to complementarily receive portions of the I/O connector devices mounted on the particular system planar board with which the bracket is to be operatively associated. Thus, using principles of the present invention, the manufacturing inventory needed to construct a variety of differently configured computers would include a supply of identically configured chassis, groups of system planar boards having differently configured series of I/O connector devices thereon, and groups of peripherally identical I/O output bracket members, the brackets in each group thereof having formed therein I/O connection opening means configured to complementarily receive portions of the I/O connector devices on the planar boards of one of the groups thereof.

Accordingly, to construct a computer of a selected configuration, the necessary planar board is secured to one of the identical chassis (preferably to the inner side of its first wall), one of the I/O brackets having the proper I/O connection opening means configuration is operatively placed in the second chassis wall cutout area, and portions of the I/O connector devices of the planar board are complementarily positioned within the I/O connection opening means.

In this manner a single base chassis may be used in the construction of computers of a variety of configurations. This eliminates the previous necessity of inventorying chassis of multiple configurations and using several metal parts to construct each I/O connector device/chassis interface, and also substantially reduces EMI sealing problems at such interface. Moreover, the tooling costs and overall fabrication costs associated with manufacturing a line of computers are correspondingly reduced.

DETAILED DESCRIPTION

Figure 1:
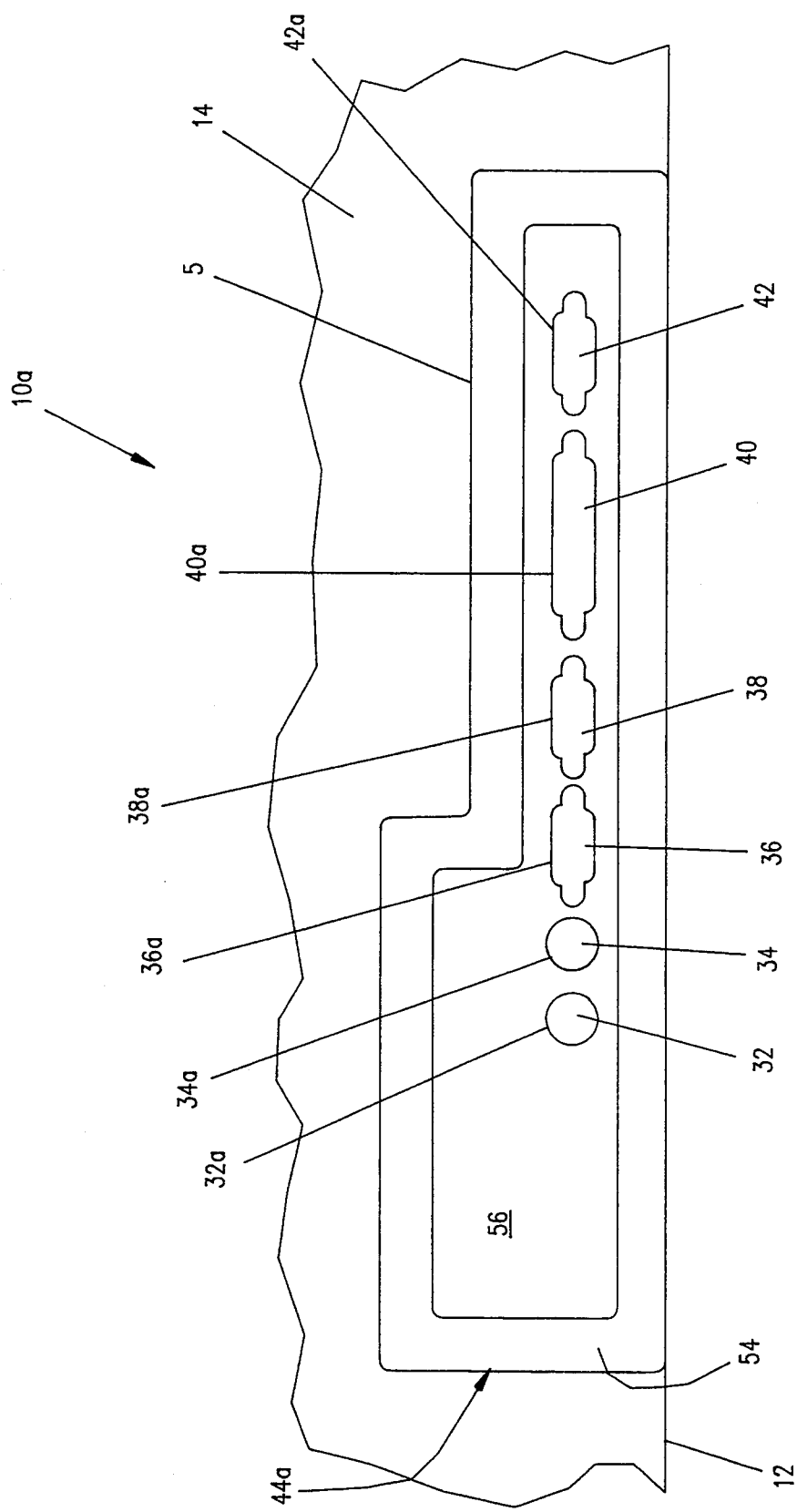
FIGS. 1 and 2 are highly schematic partial rear end elevational views of a pair of computer chassis constructed using two specially designed I/O output bracket structures embodying principles of the present invention and having different connection opening patterns therein.
Figure 2:
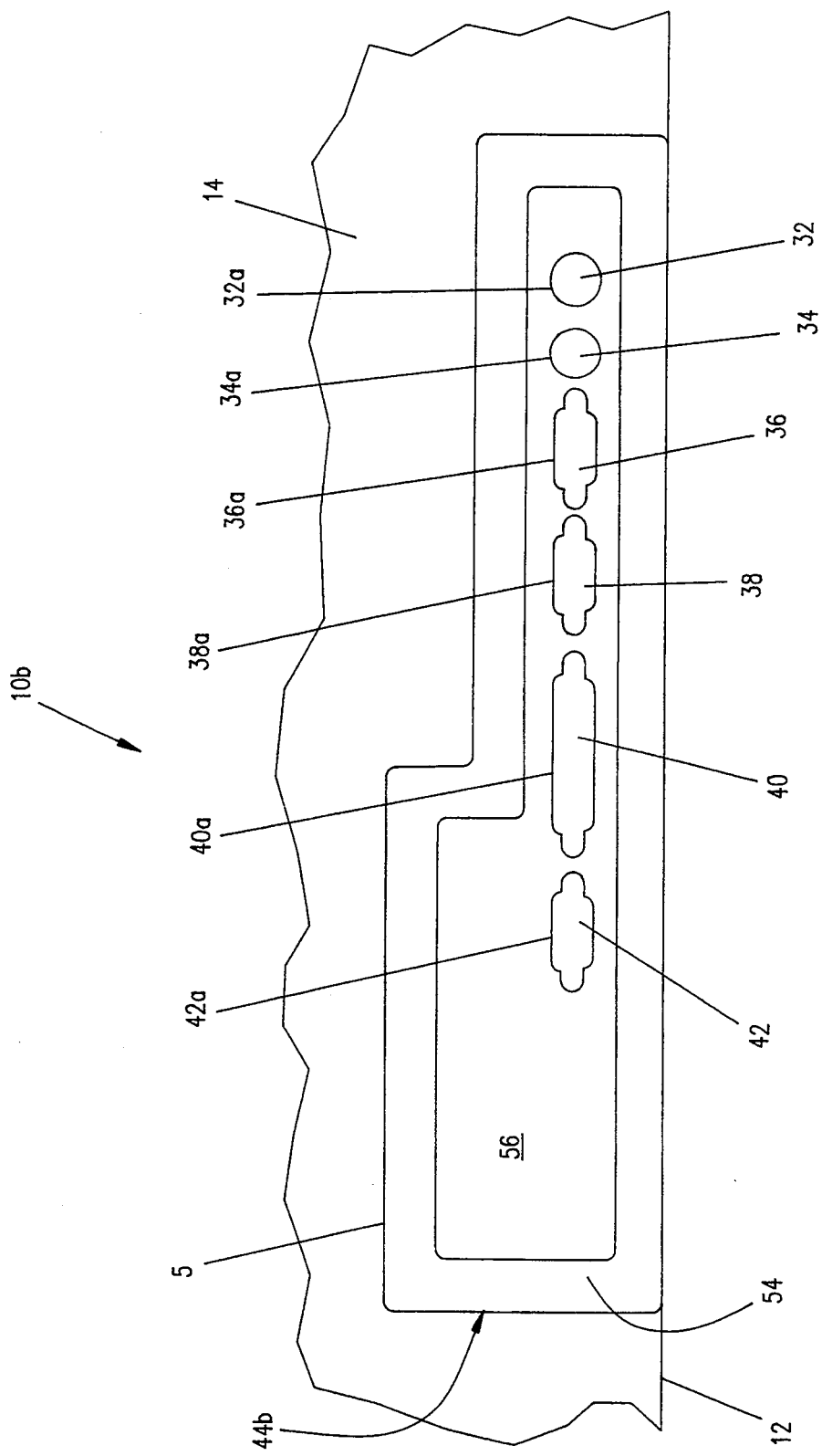

Schematically depicted in FIGS. 1 and 2, in exterior elevation, are rear end portions of a pair of computer chassis 10a and 10b which are basically hollow rectangular sheet metal housings within which the operating components of their associated computers are operatively disposed. According to an important aspect of the present invention, despite the fact that such computers have differently arranged operating components therein that require correspondingly different external I/O connection patterns, the chassis 10a,10b have identical shapes and sizes and do not have to be modified to accommodate variations in operating component configurations and arrangements of the computers in which they are incorporated. Thus, a single chassis configuration may be used in the construction of a variety of computers having a wide variety of operating capacities and operating component arrangement configurations.

Figure 6:
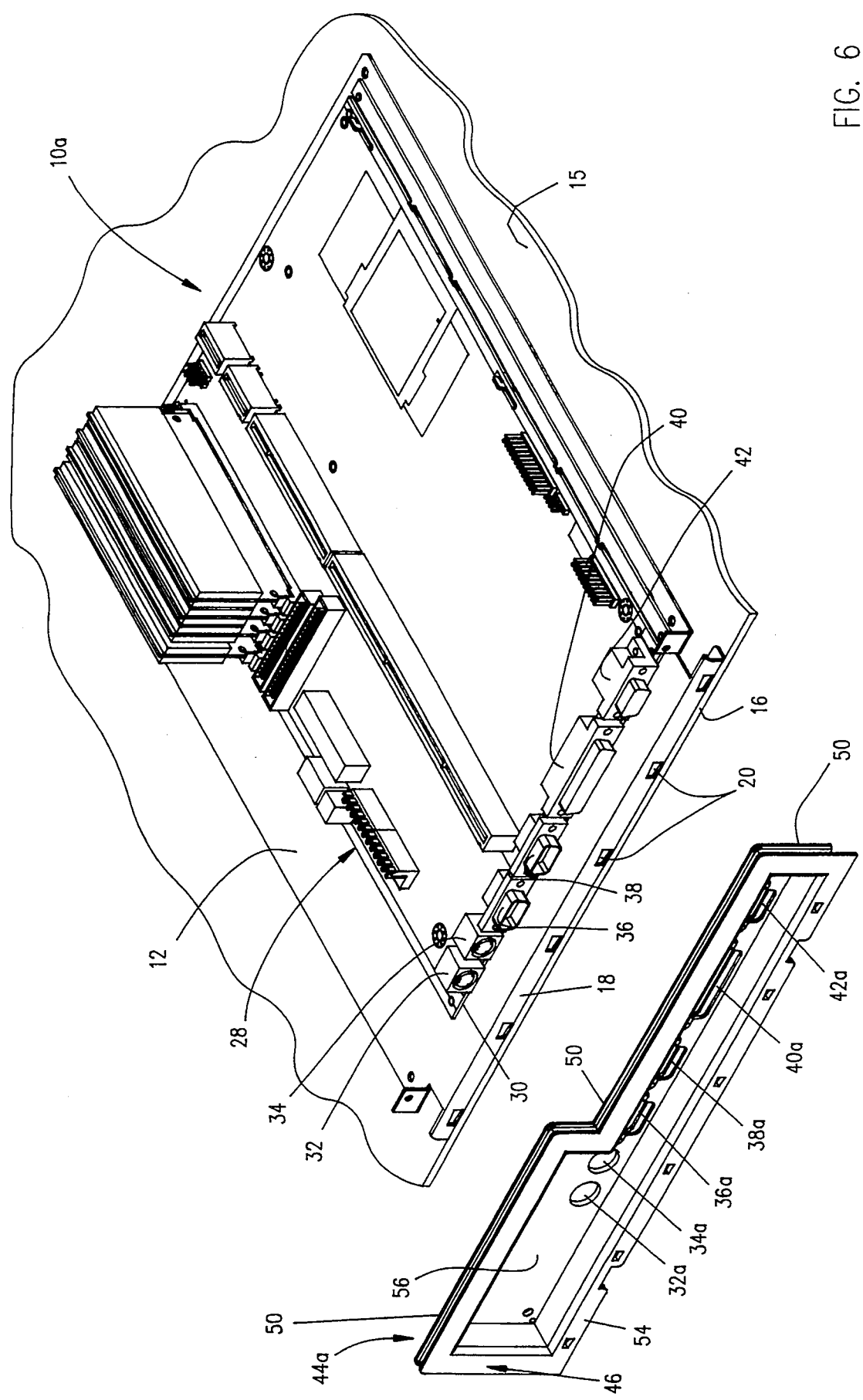
FIGS. 6–8 are perspective views of the FIG. 1 I/O output bracket and sequentially illustrate its operative connection to its associated computer chassis.
Figure 7:
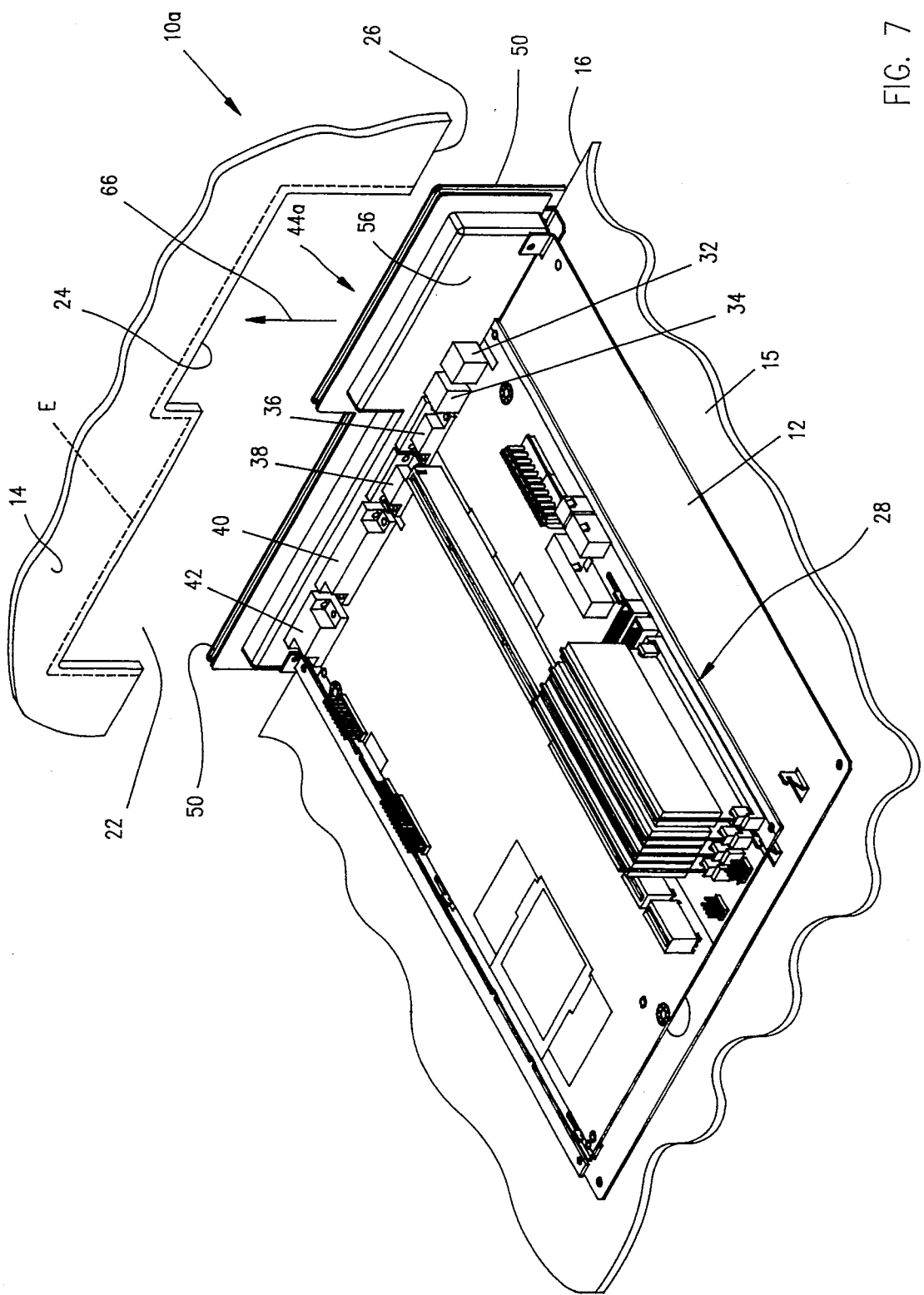
Figure 8:
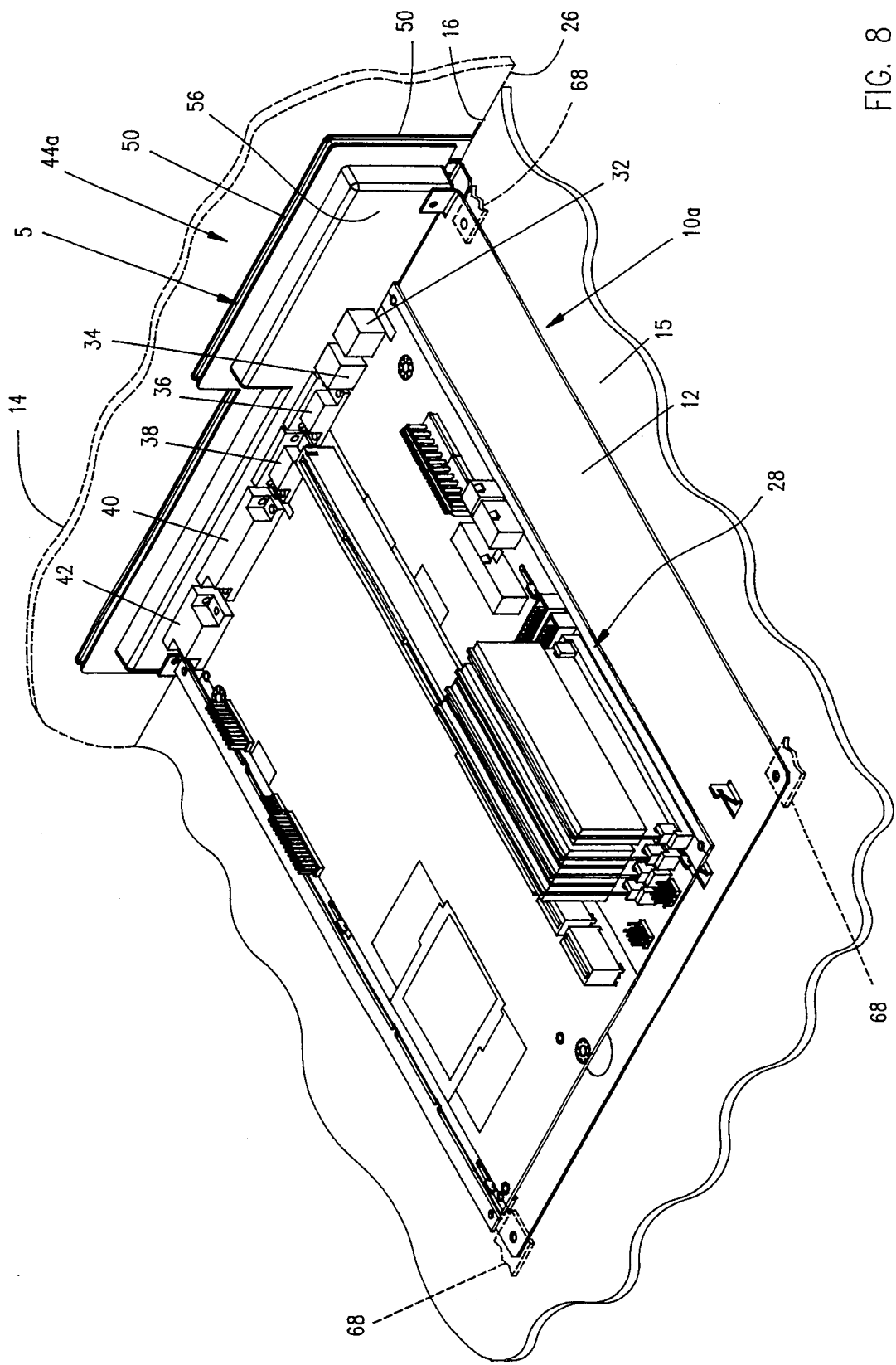

As shown in FIGS. 6-8, each of the identically configured rectangular chassis 10a,10b (chassis 10a being illustrated in FIGS. 6-8) has a side wall 12 and a rear end wall 14 extending perpendicularly thereto. Chassis 10a is disposed within a plastic housing, a side wall 15 of which is illustrated in FIGS. 6-8. For purposes later described, along its rear edge 16 the chassis side wall 12 has an upstanding flange 18 having a horizontally spaced series of rectangular openings 20 therein (see FIG. 6). A rectangular cutout area 22, having a vertically enlarged area 24, is formed in the bottom side edge 26 of the rear end wall 14 as best illustrated in FIG. 7.

A system planar board 28 having a rear end edge 30 positioned. forwardly of and parallel to the flange 18 (see FIG. 6) is suitably secured to the top side of the wall 12 of chassis 10a. Mounted on the top side of board 28 and extending along a rear edge portion thereof are a series of I/O connector devices comprising, from left to right as viewed in FIG. 6, a keyboard connector 32, a mouse connector 34, two serial port connectors 36 and 38, a parallel port connector 40 and a monitor connector 42.

For purposes of discussion and comparison it will be assumed that the system planar board similarly mounted on the chassis 10b (see FIG. 2) has these same I/O connector devices, but that (as viewed in FIG. 2) their left-to-right sequence is reversed compared to their counterparts in chassis 10a shown in FIG. 1. Specifically, in the chassis 10b the monitor port 42 is on the left and the keyboard connector is on the right as viewed from the rear of the chassis.

As mentioned above, despite the fact that the external I/O connection patterns are different in the chassis 10a and 10b, the two chassis have identical configurations. In accordance with a key aspect of the present invention, this advantageous ability to use identically configured chassis arises from the use of two specially designed I/O output bracket members 44a and 44b which are respectively associated with the chassis 10a,10b and have openings 32a,34a,36a,38a,40a and 42a therein through which access is provided to the I/O connector devices of their chassis as later described. Collectively, these openings may be termed I/O opening means through which operative external connections may be made tc the I/O connector devices within the chassis.

Figure 3:
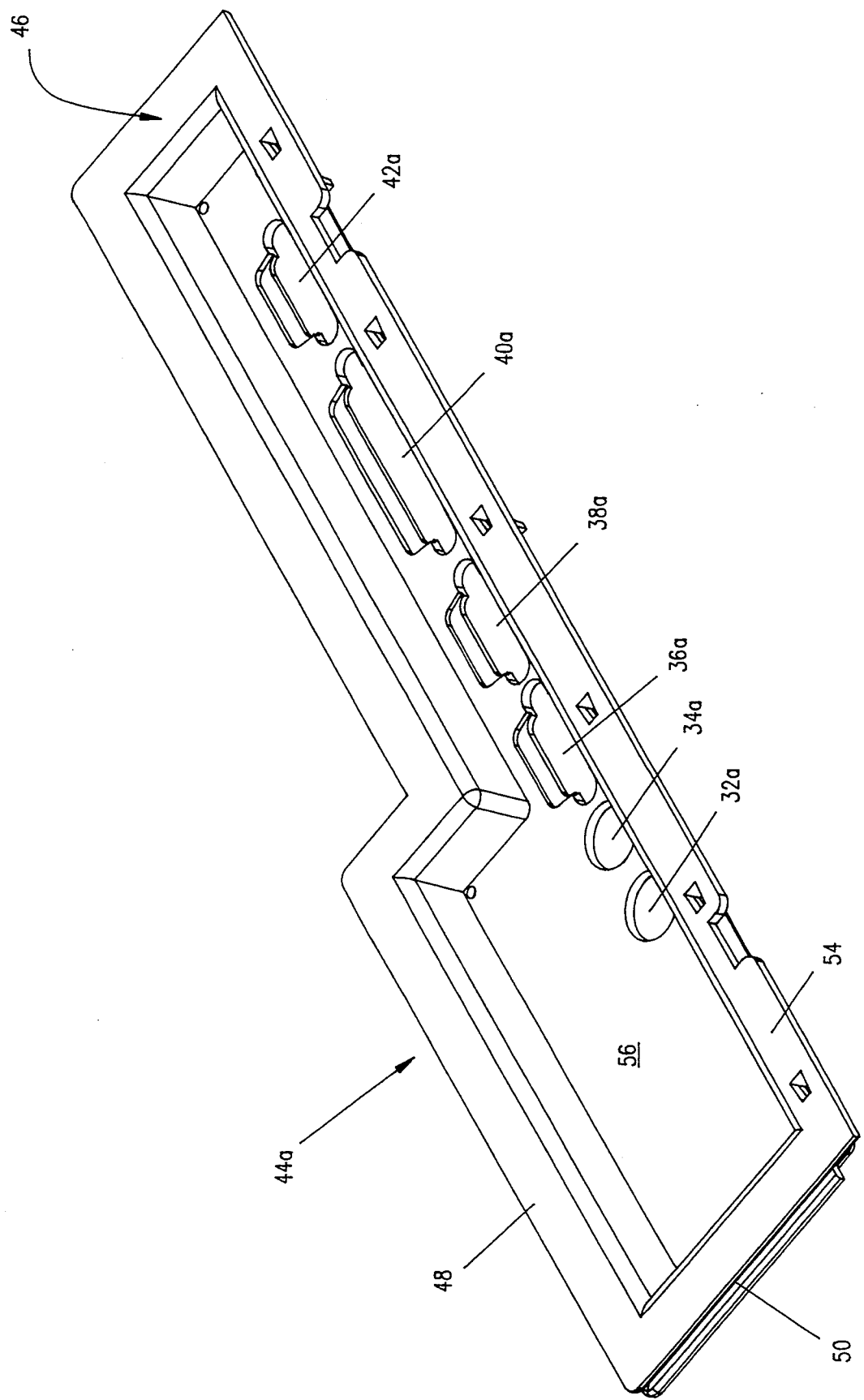
FIG. 3 is an enlarged scale outer side perspective view of the FIG. 1 I/O output bracket removed from its associated chassis.
Figure 4:
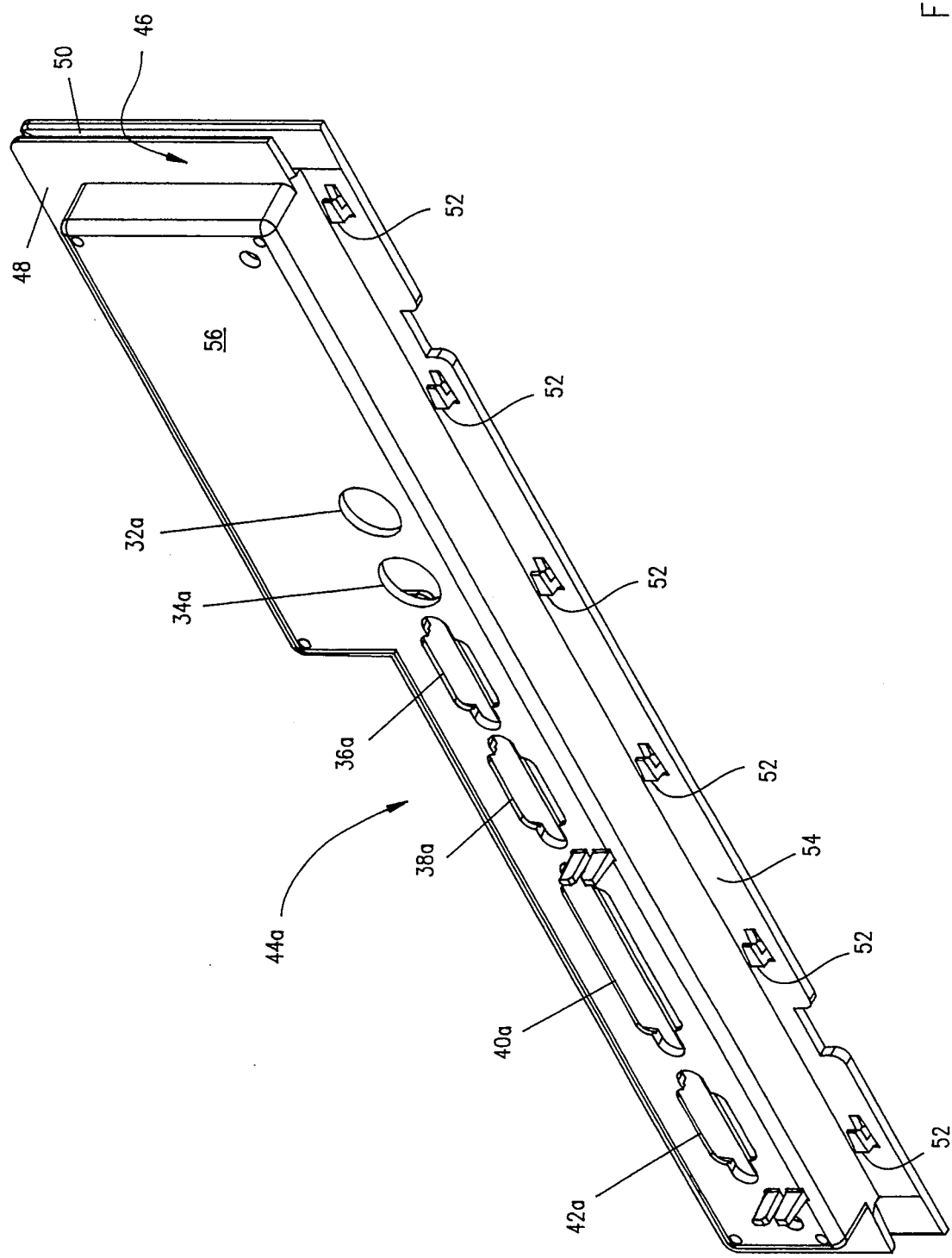
FIG. 4 is an enlarged scale inner side perspective view of the FIG. 1 I/O output bracket removed from its associated chassis.

With the exception of the arrangements of these I/O opening means formed therein, the I/O brackets 44a,44b have identical configurations. Accordingly, for purposes of illustration the I/O bracket 44a will now be described in conjunction with FIGS. 3 and 4.

I/O bracket 44a, like bracket 44b is of a unitary construction and is preferably formed as an injection plastic molding as later described herein. For EMI grounding purposes, the bracket 44a coated with a conductive metallic coating preferably applied using a suitable electroless plating process. The bracket 44a, like the bracket 44b, has a horizontally elongated rectangular border flange portion 46 having an end portion 48 enlarged in a vertical direction. For purposes later described, a continuous peripheral groove 50 extends along the top side and opposite ends of the flange 46, and a horizontally spaced series of hook projections 52 are formed on the inner side of the elongated bottom strip portion 54 of the flange 46. Inwardly offset from the flange 46 is a base wall portion 56 in which the I/O connection openings 32a–42a are formed.

Figure 5:
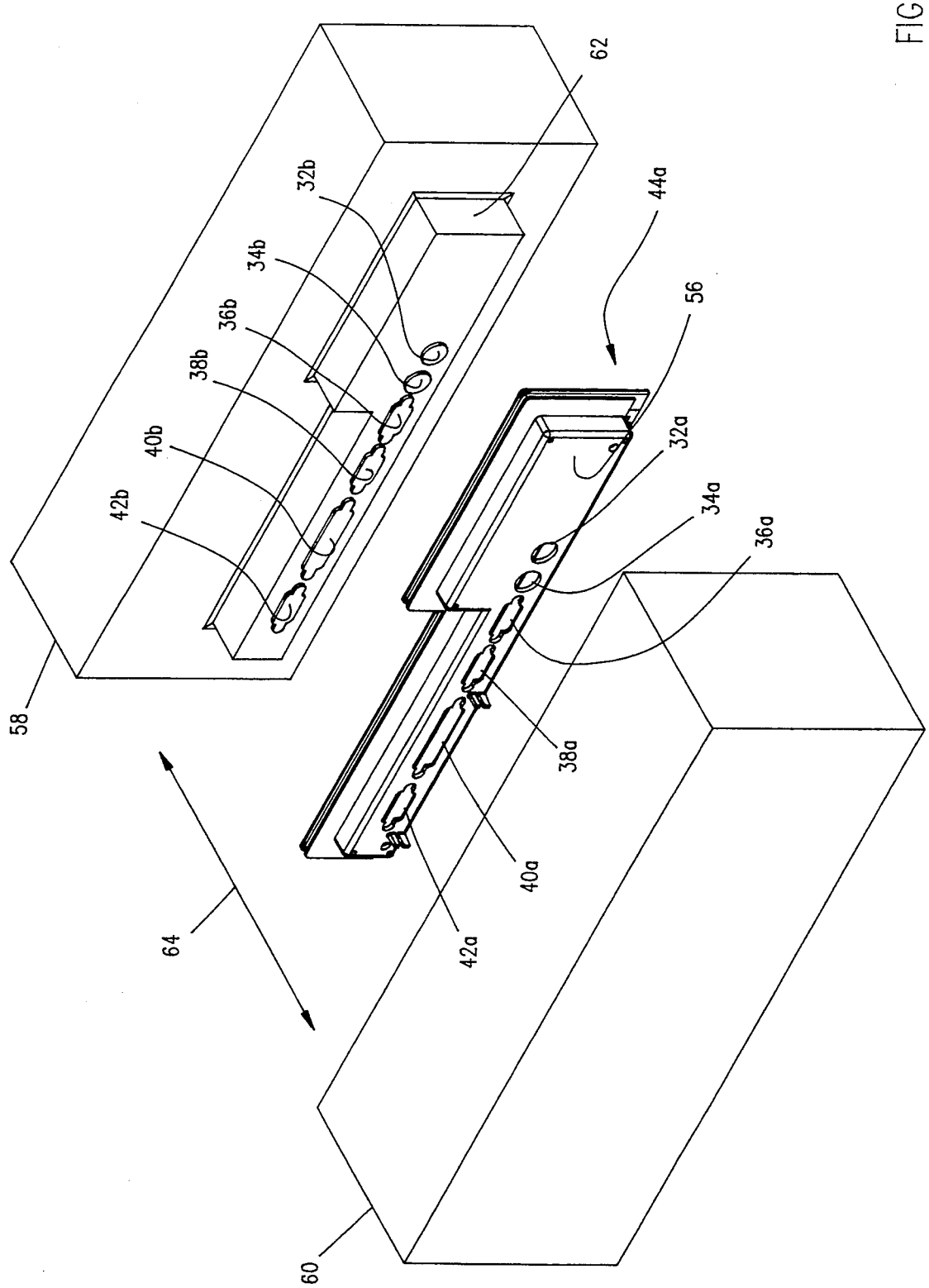
FIG. 5 is an exploded schematic perspective view of a portion of an injection molding die structure representatively used to form the FIG. 1 I/O output bracket.

Referring now to FIG. 5, the illustrated unitary plastic I/O bracket 44a is injection molded using the schematically depicted fixed and movable mold inserts 58 and 60. The fixed insert 58 has a forming projection 62 disposed on one side thereof and having a series of outwardly projecting bosses 32b–42b. When the insert 60 is moved into engagement with and then retracted from the insert 58, as indicated by the double-ended arrow 64, the bracket 44a is formed, with the bosses 32b–42b creating the I/O connection openings 32a–42a in the base wall 56 of the resulting I/O bracket 44a.

To form the alternatively configured I/O bracket 44b, the fixed mold insert 58 is simply replaced with one having an identically configured forming projection 62 with the bosses 32b–42b thereon being rearranged to form in the resulting I/O bracket 44b the correspondingly rearranged I/O connection openings 32a–42a as may be seen by comparing FIGS. 1 and 2.

Turning to FIGS. 6–8, the construction of the chassis 10a will now be described. The I/O output bracket 44a is operatively attached to the chassis wall 12 of chassis 10a by positioning the bracket in its FIG. 6 orientation relative to the chassis wall 12, inserting the bracket hooks 52 (see FIG. 4) into the openings 20 in flange 18, and then moving the bracket lengthwise to snap it into place on the flange 18. The planar board 28 is then placed atop, the chassis wall 12 in a manner such that projecting socket portions of the I/O connectors 32–42 respectively and complementarily enter their associated bracket openings 32a–42a as shown in FIG. 1. The planar board 28 is then suitably secured to the chassis wall 12.

Next, as illustrated in FIG. 7, the rear end wall 14 of the chassis 10a is positioned above the rear edge 16 of the base wall 12 with the end wall cutout area 22 in alignment with the I/O bracket 44a. As indicated by the arrow 66, the wall 12 is then moved upwardly to its FIG. 8 position in which the bottom edge 26 of the rear end wall 14 is contiguous with the rear edge 16 of the chassis wall 12, and a peripheral wall edge portion E of the rear end wall cutout area 22 (schematically shown as being bounded by the dotted line in FIG. 7) enters the bracket groove 50. The chassis wall 12 is then secured to chassis tabs 68 (portions of which are shown in phantom in FIG. 8), formed on an adjacent chassis wall (not illustrated), using mounting screws (also not illustrated).

The receipt of the end wall edge portion E in the bracket groove 50 forms an EMI seal S around the top and end portions of the periphery of the bracket flange S. Due to the tongue-in-groove nature of this cooperative seal structure, this seal is of a highly effective labyrinth configuration.

In constructing the identically configured chassis 10b, which incorporates therein a planar board in which the horizontal sequence of the I/O connector devices 32–42 is horizontally reversed, the peripherally identical I/O output bracket 44b is simply substituted for the bracket 10a to adjust for the differently arranged I/O connector devices within the chassis 10b. Like the bracket 10a, the bracket 10b is complementarily received in the cutout area 22 of chassis end wall 14 and forms the labyrinth EMI seal S therewith.

From the foregoing it can readily be seen that by using two peripherally identical I/O output brackets 44a,44b having different I/O opening arrangements therein, two differently configured computers can be selectively fabricated using the same sheet metal chassis. Stated in another manner, it is not necessary to alter the chassis configuration for each desired change of the I/O, connector orientation of the planar board incorporated in the associated computer. This ability to standardize the chassis configuration, as will be appreciated, can substantially reduce the production inventory, tooling costs and overall fabrication costs associated with manufacturing a line of computers.

For purposes of illustration, the representative difference between the I/O opening means formed in the bracket 44a and those formed in bracket 44b has been shown as being a horizontal reversal of the sequence of the openings 32a–42a. It will be readily appreciated, however, that other configurational differences. between such I/O opening means, such as opening size and shape differences, can also be easily incorporated in a series of I/O output brackets of the present invention.

The foregoing detailed description is to be clearly understood as being given by way of illustration and example only, the spirit and scope of the present invention being limited solely by the appended claims.

WHAT IS CLAIMED IS:

1. Computer apparatus comprising;
a metal chassis having contiguous, perpendicular first and second walls having inner sides, said second wall having a cutout area formed therein; and
a unitary I/O output bracket member removably and complementarily received in and covering said cutout area, said unitary I/O output bracket member having:
a periphery cooperating with a peripheral wall edge portion of said cutout area to form therewith an EMI seal, and
a plurality of I/O connection openings configured and arranged to complementarily receive a plurality of I/O connector devices operatively mounted on a printed circuit board carried by said chassis.

2. The computer apparatus of claim 1 wherein:
a substantial portion of said periphery of said I/O output bracket member has a groove formed therein, and
said peripheral wall edge portion of said cutout area is received in said groove and cooperatively defines said EMI seal therewith.

3. The computer apparatus of claim 1 wherein:
said unitary I/O output bracket structure is a plastic injection molding externally coated with an electrically conductive material.

4. The computer apparatus of claim 3 further comprising:

a system planar board carried by said chassis and having mounted thereon a plurality of I/O connector devices, portions which are complementarily received in said plurality of I/O connection openings.

5. The computer apparatus of claim 4 wherein:
said system planar board is secured to said inner side of said first wall.

6. Computer apparatus comprising:
a metal chassis having contiguous, perpendicular first and second walls with inner sides, said second wall having a cutout area formed therein;
a unitary plastic I/O output bracket member removably and complementarily received in said cutout area, said output bracket member having a plurality of I/O connection openings formed therein; and
a printed circuit board carried by said chassis, said printed circuit board having I/O connector devices operatively mounted thereon, all of the I/O connector devices on said printed circuit board having portions thereof complementarily received in said I/O connection openings.

7. The computer apparatus of claim 6 wherein:
said unitary plastic I/O output bracket member is a plastic injection molding and is externally coated with an electrically conductive material.

8. The computer apparatus of claim 6 further comprising:
cooperating means on said I/O bracket member and said second wall for forming an EMI joint at their juncture.

9. The computer apparatus of claim 8 wherein:
said I/O output bracket member has a periphery, and
said cooperating means include a groove extending around a substantial portion of said periphery and a wall edge portion of said cutout area received in said groove.

10. A method of constructing first and second differently configured computer structures, said method comprising the steps of:
forming essentially identical first and second metal chassis each having contiguous, perpendicular first and second walls,
said first and second metal chassis having essentially identical cutout areas formed in said second walls thereof;
providing first and second printed circuit boards having mounted thereon differently configured series of I/O connector devices;
providing first and second unitary I/O output bracket members each being configured to be operatively received in and cover either of said chassis wall cutout areas,
said first I/O output bracket member having formed therein a series of I/O connection openings configured complementarily receive portions of said I/O connector devices on said first printed circuit board,
said second I/O output bracket member having formed therein a series of I/O connection openings configured to complementarily receive portions of said I/O connector devices on said second printed circuit board;
securing said first printed circuit board to either of said first and second metal chassis;
securing said second printed circuit board to the other of said first and second metal chassis;

operatively placing said first I/O output bracket member in the cutout area of the chassis to which said first printed circuit board is secured;

complementarily positioning portions of the I/O connector devices of said first printed circuit board in said I/O connection openings of said first I/O output bracket member;

operatively placing said second I/O output bracket member in the cutout area of the chassis to which said second printed circuit: board is secured; and complementarily positioning portions of the I/O connector devices of said second printed circuit board in said I/O connection openings of said second I/O output bracket member.

11. The method of claim 10 further comprising the steps of:

forming said first and second I/O output bracket members from a plastic material, and externally coating said first and second I/O output bracket members with an electrically conductive material.

12. The method of claim 10 further comprising the step of:

configuring peripheral portions of said first and second I/O output bracket members to receive wall edge portions of the cutout areas in which they are operatively placed and form with the received wall edge portions labyrinth EMI seal areas.

* * * * *